(12) United States Patent
Aziz

(10) Patent No.: US 10,996,275 B2
(45) Date of Patent: May 4, 2021

(54) LOW VOLTAGE RIDE-THROUGH TEST APPARATUS AND METHOD OF USING SAME

(71) Applicant: Saudi Arabian Oil Company, Dhahran (SA)

(72) Inventor: Athanatu Mohammad Aziz, Abqaiq (SA)

(73) Assignee: Saudi Arabian Oil Company, Dhahran (SA)

( * ) Notice: Subject to any disclaimer, the term of this patent is extended or adjusted under 35 U.S.C. 154(b) by 53 days.

(21) Appl. No.: 16/357,757

(22) Filed: Mar. 19, 2019

(65) Prior Publication Data
US 2020/0300916 A1    Sep. 24, 2020

(51) Int. Cl.
*G01R 31/34*    (2020.01)

(52) U.S. Cl.
CPC ......... *G01R 31/343* (2013.01); *G01R 31/346* (2013.01)

(58) Field of Classification Search
CPC .... H02P 1/26; H02P 1/026; H02P 1/04; H02P 29/0243; H02P 3/18; H02P 1/022;
(Continued)

(56) References Cited

U.S. PATENT DOCUMENTS

| | | |
|---|---|---|
| 4,736,158 A | 4/1988 | McCartney |
| 5,055,793 A | 10/1991 | Mulcahey |

(Continued)

FOREIGN PATENT DOCUMENTS

| | | |
|---|---|---|
| EP | 2863235 A1 | 4/2015 |
| EP | 3056916 A1 | 8/2016 |
| WO | 200060430 A1 | 10/2000 |

OTHER PUBLICATIONS

C. Wessels, R. Lohde and FW Fuchs, Transformer Based Voltage Sag Generator to Perform LVRT and HVRT tests in the Laboratory; Instituted of Power Electronics and Electrical Drives, Christian-Albrechts-University of Kiel, DE; 14th Int'n Power Electronics and Motion control conference, EPE-PEMC 2010.
(Continued)

*Primary Examiner* — Vinh P Nguyen
(74) *Attorney, Agent, or Firm* — Abelman, Frayne & Schwab

(57) ABSTRACT

A portable ride-through (RT) tester provides a voltage drop at control circuitry of a motor starter to test its RT capabilities. The RT tester includes a variable transformer for manually controlling the magnitude of the voltage drop. Timing circuitry is programmed to count cycles of a 120 VAC input voltage to affect the occurrence and duration of the voltage drop. The primary windings of the transformer are connected to the 120 VAC. The variable secondary winding is connected to output terminals, which are electrically connected to the starter control circuitry via conductive probes. The power circuit of the starter is disengaged during testing. The timers sequentially provide the 120 VAC input voltage and the voltage drop at the starter control circuitry. Repeated testing at different durations and monitoring for tripping of relays/solenoids of the starter enables the tester to determine the exact ride-through capability of the motor starter.

17 Claims, 5 Drawing Sheets

(58) Field of Classification Search
CPC ...... H02P 1/24; H02P 1/58; H02P 6/20; H02P 9/04; H01H 47/002; H01H 47/22; H01H 50/86; H01H 47/325; H01H 51/065; G06F 11/0751
See application file for complete search history.

(56) References Cited

U.S. PATENT DOCUMENTS

| | | | | |
|---|---|---|---|---|
| 5,448,442 | A * | 9/1995 | Farag | H02H 7/0822 361/24 |
| 5,563,489 | A * | 10/1996 | Murry | G01R 31/50 318/778 |
| 5,751,132 | A * | 5/1998 | Horvath | G01R 31/343 318/798 |
| 5,920,132 | A | 7/1999 | Rockfield, Jr. et al. | |
| 5,929,624 | A | 7/1999 | Ricq et al. | |
| 6,285,169 | B1 | 9/2001 | McEachern | |
| 6,759,765 | B2 | 7/2004 | McEachern et al. | |
| 7,038,423 | B2 * | 5/2006 | Reed | H02P 1/029 318/727 |
| 7,176,648 | B2 * | 2/2007 | Choi | B29C 45/7666 318/625 |
| 7,405,542 | B1 * | 7/2008 | McAvoy | H02P 5/747 322/14 |
| 7,459,877 | B2 * | 12/2008 | Cook | H02P 1/30 318/778 |
| 7,902,810 | B2 | 3/2011 | Naylor et al. | |
| 8,290,692 | B2 * | 10/2012 | Kitano | F02N 11/0855 701/113 |
| 8,373,373 | B2 * | 2/2013 | Vanweelden | H04B 3/32 318/430 |
| 10,812,007 | B1 * | 10/2020 | Fraser | H02P 29/028 |
| 2009/0066166 | A1 | 3/2009 | Llorente | |
| 2012/0139576 | A1 | 6/2012 | Dreyer | |

OTHER PUBLICATIONS

Hong-bin Hu, Qing-tian Meng, He Bu, Yong-feng Ren, Test and Analysis of Low Voltage Ride-through Characteristics of Wind Farm; IJape, vol. 2, May, 4, 2013.
Schweitzer engineering Laboratories, Inc. SEL-551/SEL-551C Overcurrent and Reclosing Relay Data Sheet Nov. 5, 2015.
Cesar Alberto Rincon; Voltage Dip Mitigation for Motor Starters Using an Adaptive High Speed Relay Protection on the High Voltage Transmission System-A Thesis submitted to the graduat faculty of Louisiana State University, Aug. 2008.
NoiseKen Voltage Dip; and Up Simulator VDS-2002 Data Sheet, 2010.
PG&E-Voltage Sag Ride-through Mitigation in Sequence by Increasing Cost; Aug. 1, 2000.
Yongheng Yang et al: "Benchmarking of Voltage Sag Generators", IECON 2012-38th Annual conference on IEEE Industrial Electronics Society, IEE Oct. 25, 2012; ISBN: 978-1-4673-2419-9 pp. 943-948, FIGS. 1,2,5,6,10-12.
IEEE Trial-Use Recommended Practice for Voltage Sag and Short interruption Ride-Through Testing for End-Use Electrical Equipment Rated Less than 1000V; IEEE Std 1668-2014; Sep. 22, 2014, pp. 1-92.
Smolka T et al: Grid Integration of Wind Energy Converter-Experieces of Measurements and Status Quo of Certifcation Procedures-Integration of Wide-Scale Renewable Resources into the Power Delivery System, 2009 CIGRE/IEEE Pes Joint Symposium, Jul. 29, 2009, pp. 1-15.
International Search Report & Written Opinion-PCT/US2020/020784, dated Jun. 19, 2020.

* cited by examiner

LOW VOLTAGE RIDE-THROUGH TEST APPARATUS AND METHOD OF USING SAME

FIELD OF INVENTION

The present invention relates to electronic test equipment and more specifically, to a portable electric test apparatus for determining and monitoring ride-through capabilities of an electric motor starter.

BACKGROUND OF INVENTION

Industrial facilities such as petro-chemical processing plants which refine and/or otherwise process petroleum and natural gases, automotive factories, textile plants, food and beverage facilities, metal foundries, power utilities facilities, pharmaceutical plants and the like can typically implement various types and quantities of AC powered electric motors which operate the required processing/manufacturing machinery and equipment for producing/fabricating the products which are sold to businesses and consumers. In many instances, the industrial AC electric motors receive power from an external high voltage power source (mains) typically rated at 2.4 KV or 4.16 KV.

The electric AC motors are each typically controlled by an electric motor starter having overload and ride-through protection circuitry. Under normal operating conditions, the motor starter is in a closed state and thereby supplies electrical power from the mains to the electric motor to operate the machinery/equipment. Conversely, when a prolonged power overload or power sag/drop condition occurs, the motor starter can trip into an open state, thereby terminating power to the electric motor and shutting down the machinery. Motor starters are available from numerous electrical suppliers such as from Eaton Corporation's Cutler-Hammer division, ABB Ltd., Nelson Electric Inc., and the like. In order to avoid an abrupt shutdown of the plant machinery during an intermittent occurrence of a power spike and/or drop, the manufacturers of the motor starters typically include motor protection circuitry such as overload and ride-through protection.

More specifically, the electric motor starters include high voltage output power circuitry which is rated to match and deliver the required voltage (2.4 KV or 4.16 KV) to the electric motor, and a control circuit which administers the high voltage power circuit of the motor starter in response to, for example, user commands or the protection circuitry detecting a power surge, sag/drop or other undesirable condition. The control circuit of the motor starter is typically powered by an auxiliary control power transformer having a secondary voltage that is rated at 120 volts. The control power transformer (CPT) is an integral part of motor starter which provides the required control voltage for the motor starter. The electric motor starters also include circuitry that provides the ride-through capability, which is the ability to deliver usable power for a limited time during a power loss or sag from the input power source. Ride-through capability is highly beneficial during intermittent power outages of durations less than one second which, without such protection, could otherwise cause an electric motor, computer system and/or other electronic equipment to shut down abruptly and possibly damage the internal circuitry.

Motor starter manufacturers typically provide ride-through circuitry to sustain power for at least a 12 cycles from the power supply so that the process or manufacturing machinery at a plant will not be affected. The 12 cycle minimal ride-through capability is generally an international standard. During a power drop event, if the input voltage returns within the 12 cycles, the motor starter will not trip open and will continue to operate in its closed state so that the process/manufacturing equipment will also continue to operate normally without any interruption. If however, a motor starter solenoid or relay trips to an open state before the 12 cycles have lapsed, e.g., within 2 cycle or 5 cycles, there can be frequent interruptions in the machinery operations. In some industries (e.g., petrochemical industry, among others), unanticipated power interruptions can cause hours or even a days of delays before the process/manufacturing machines can be fully operational again due to the complexity of the processes that the machinery must carry out. Manufacturers attain the desired ride-through characteristics using RC circuits to delay the tripping of the solenoids/relays in the motor starter. However, over time, usage, environmental and other factors, the manufacturer specified values of the RC circuitry can drift so that the ride-through time of the motor starter is no longer at the minimum 12 cycle duration.

A brief review of the prior art reveals that various test equipment that produce voltage dip and swell simulators and/or generators. For example, U.S. Pat. No. 5,910,132 to Rockfield, Jr. et al. discloses a portable voltage sag generator which intentionally creates power quality disturbances by using cascading transformers with various voltage taps and switches which are interconnected between the utility power source and the load. The physical transformer connections provide the magnitude of the voltage sag. Timing logic circuits for actuating the switches are provided to set the duration of the voltage sag.

U.S. Pat. No. 6,759,765 to McEachern et al. also discloses a portable transformer based voltage sag generator having at least one voltage tap, and a plurality of switches of different technologies in which at least two switches are connected in parallel to each tap. Logic circuitry activates the switches at predetermined intervals so as to provide minimal power dissipation for electromechanical contacts, as well as phase control and clean transitions for solid-state switches when implementing a voltage sag at the output of the sag generator test device. Although the '132 and '765 patents disclose various circuits for providing voltage sags at an output of a voltage sag generator, these test apparatus are devoid of any circuitry to measure the ride though capabilities of a load, such as a motor starter.

European patent no. EP 2863,235 to Li discloses a shunt impedance based voltage sag generator test device for creating and detecting the capability of low voltage ride-through of a grid-connected photo-voltaic inverter. The shunt impedance is used to decrease the line voltage, while the series impedance immunizes the grid from the fault. The magnitude of the voltage dip is adjusted by changing the values of the impedance via an impedance bank. A switch is provided to connect the line directly to ground to produce voltage dips illustratively down to zero volts.

The prior art references discussed above are generally heavy-duty, laboratory related test equipment which are highly comprehensive and costly in design, and often suitable for direct connectivity with the power system, i.e., the grid. As such, the prior art sag generators act as a source of power for administering 'disturbed' voltages directly to the loads (motors) and are not suitable in instances where maintenance and troubleshooting is a prime concern. Further, it has been observed that facility and plant maintenance personnel do not have the capability to easily check the ride-through capabilities of the motor starters for the electric motors associate with their various processing and manufacturing machinery at the facility or plant.

Therefore, there is a need in the art for a simply designed, low voltage ride-through test device which can be easily transported and used at a power plant or industrialized facility to enable a field/maintenance technician to test and observe if a motor starter has ride-through capabilities that match the manufacturer's specifications. It is also desirable to provide a ride-through test device which can be used ubiquitously with different starter motor models from various manufacturers. It is further desirable to provide a ride-through test device in which the magnitude and duration of a voltage drop can be easily and quickly changed, such that a technician can use the test device to determine minimum and maximum ride-through metrics of a motor starter. It is further desired that ride-through test device be portable so that it can be easily transported from one electric motor location to another at a facility, is easy to maintain and operate by a single person, and is cost effective to manufacture. It is further desired that the ride-through test device operates as a 'manipulator' in the motor starter control system, as opposed to being a source of power that is connected with the load, i.e., the high voltage output power circuitry or the motor itself, as discussed above with respect to the prior art.

It is also desirable to provide a low voltage ride-through test device that can be used to evaluate the root cause of the equipment failure during voltage sag, and thereby enable quicker remediation of the problem so that the process/manufacturing machinery at a facility will be restored with minimal down time. That is, a voltage dip is apparent when transient recorders or other measuring instruments are used to monitor motor starters. However, where a motor starter trips off during a voltage sag condition, a primary cause of the trip would be the absence of a ride-through mechanism within the starter motor. Accordingly, it is desirable to have a ride-through test apparatus which can provide early detection of motor starter ride-through capabilities at a facility.

SUMMARY OF THE INVENTION

The disadvantages and shortcomings of the prior art are overcome by a low voltage ride-through test apparatus and a method of using the same in which, a portable ride-through (RT) test apparatus provides a voltage drop at control circuitry of a motor starter to test its RT capabilities. The RT test apparatus includes a variable transformer for manually controlling the magnitude of the voltage drop. Timing circuitry is programmed to count cycles of a 120 VAC input voltage to affect the occurrence and duration of the voltage drop. The primary windings of the transformer are connected to the 120 VAC. The variable secondary winding is connected to output terminals, which are electrically connected to the starter control circuitry via conductive probes. The power circuit of the starter is disengaged during testing. The timers sequentially provide the 120 VAC input voltage and the voltage drop at the starter control circuitry. Repeated testing at different durations and monitoring for tripping of relays/solenoids of the starter enables the tester to determine the exact ride-through capability of the motor starter.

In one embodiment, a ride-through test apparatus for providing a predetermined voltage drop on a control circuit of a motor starter comprises: a housing having an interior; a variable transformer mounted in the housing interior and having a primary winding and a secondary winding, the primary winding being electrically connected to an input voltage from an external alternating current (AC) power source and the secondary winding coupled to a pair of output terminals, the pair of output terminals being configured for electrical connection to input terminals of the control circuit of the motor starter, the variable transformer having a control knob accessible from an exterior portion of the housing for manually setting magnitude of a voltage potential on the secondary winding; a programmable logic circuit (PLC) mounted in the housing interior and including a plurality of programmable timers electrically coupled to the pair of output terminals, the plurality of timers having outputs and being programmed to sequentially turn on and off for selectively controlling voltage potential magnitude and duration at the pair of output terminals based on clock cycles of the input voltage; and a first switch electrically coupled to the PLC for activating the timers to sequentially provide (i) the AC input voltage at the pair of output terminals for a first predetermined time, (ii) the predetermined voltage drop having a magnitude corresponding to the voltage potential on the secondary winding of the variable transformer for a second predetermined time after the first predetermined time lapses, and (iii) the AC input voltage at the pair of output terminals after the second predetermined time lapses.

In one aspect, the ride-through test apparatus further comprises an input power switch attached to an exterior portion of the housing to provide power from the AC power source to the primary winding of the variable transformer. In another aspect, the ride-through test apparatus further comprising an output power switch attached to the exterior portion of the housing to provide power to the pair of output terminals. In yet another aspect, the ride-through test apparatus further comprises a current protection device for preventing passage of an undesirable power surge from the AC power source. In still another aspect, the ride-through test apparatus further comprises a handle provided on an exterior portion of the housing.

In one aspect, the ride-through test apparatus further comprises a pair of probe leads each having a proximal end and a distal end, the proximal ends being configured for electrical connection with one of the pair of output terminals, and the distal ends being configured for electrical connection with input connections of the control circuit of the motor starter. In another aspect, the ride-through test apparatus further comprises at least one support coupled to a lower portion of the housing to support the ride-through test apparatus on a surface. In yet another aspect, the ride-through test apparatus further comprises a voltage meter having a display mounted on the housing and electrically connected to the secondary winding of the variable transformer. In still another aspect, the PLC includes a plurality of timers in which a first timer counts a first predetermined number of cycles of the AC input voltage to enable a user to prepare for monitoring the motor starter for the first predetermined time, a second timer for counting a second number of cycles of the AC input voltage to cause the voltage drop to occur on the pair of output terminals for the second predetermined time, and third and fourth timers for providing the input voltage at the pair of output terminals after the second predetermined time lapses. In another aspect, the input voltage to the primary windings of the variable transformer is a 120 VAC, 60 Hz input signal.

In one aspect, the ride-through test apparatus further comprises a voltage meter arranged to read a voltage potential at the secondary winding of the variable transformer. In another aspect, the ride-through test apparatus further comprises a display panel for displaying voltage potentials of the primary and secondary windings of the variable transformer.

In still another aspect, the ride-through test apparatus further comprises a connector configured to provide data flow from a computer device to program the PLC.

In another embodiment, a method for providing a predetermined voltage drop on a control circuit of a motor starter using a ride-through (RT) test apparatus including a housing having an interior; a variable transformer mounted in the housing interior and having a primary winding and a secondary winding, the primary winding receiving an AC input voltage and the secondary winding electrically coupled to a pair of output terminals, the variable transformer having a control knob accessible from an exterior portion of the housing; and a programmable logic circuit (PLC) mounted in the housing interior and including a plurality of programmable timers electrically coupled to the pair of output terminals, the plurality of timers having outputs and being programmed to sequentially turn on and off for selectively controlling voltage potential magnitude and duration at the pair of output terminals based on counting clock cycles of the AC input voltage; the method comprising: providing the AC input voltage to the primary winding of the variable transformer via a power cord connected to an external power source; programming the timers of the PLC to set a duration of the predetermined voltage drop occurring at the output terminals of the RT test apparatus during a RT test; setting the control knob of the variable transformer to set a predetermined magnitude of a voltage potential on the secondary winding; connecting a proximal end of a first of the pair of probe leads to a first of the pair of outputs of the RT test apparatus and a distal end of the first probe lead to input terminals of the control circuit of the motor starter; disengaging a power circuit of the motor starter; activating a test switch electrically coupled to the PLC for sequentially activating the timers and providing the AC input voltage at the pair of output terminals for a first predetermined time; providing, at the pair of output terminals after the first predetermined time lapses, the predetermined voltage drop having a magnitude corresponding to the voltage potential on the secondary winding of the variable transformer for a second predetermined time; providing, at the pair of output terminals after the second predetermined time lapses, the AC input voltage; monitoring for a relay or solenoid of the motor starter to remain closed or trip open; and repeating the method at a different second predetermined time until the relay or solenoid of the motor starter trips open.

In one aspect, prior to activating the test switch, the method comprises activating an output switch to provide the AC input voltage at the pair of output terminals. In another aspect, the step of providing the AC input voltage to the primary winding includes providing a 120 VAC, 60 Hz input signal to the primary winding; the step of programming the PLC to set the predetermined duration for the voltage drop occurring at the output terminals includes programming at least one of the timers of the PLC to count 600 cycles of the AC input voltage; and the step of providing the voltage potential on the secondary winding of the variable transformer for a second predetermined time includes programming at least one of the timers of the PLC to count 12 cycles of the AC input voltage. In yet another aspect, the step of setting the control knob of the variable transformer includes setting the secondary winding of the variable transformer to zero volts.

Figure 1:
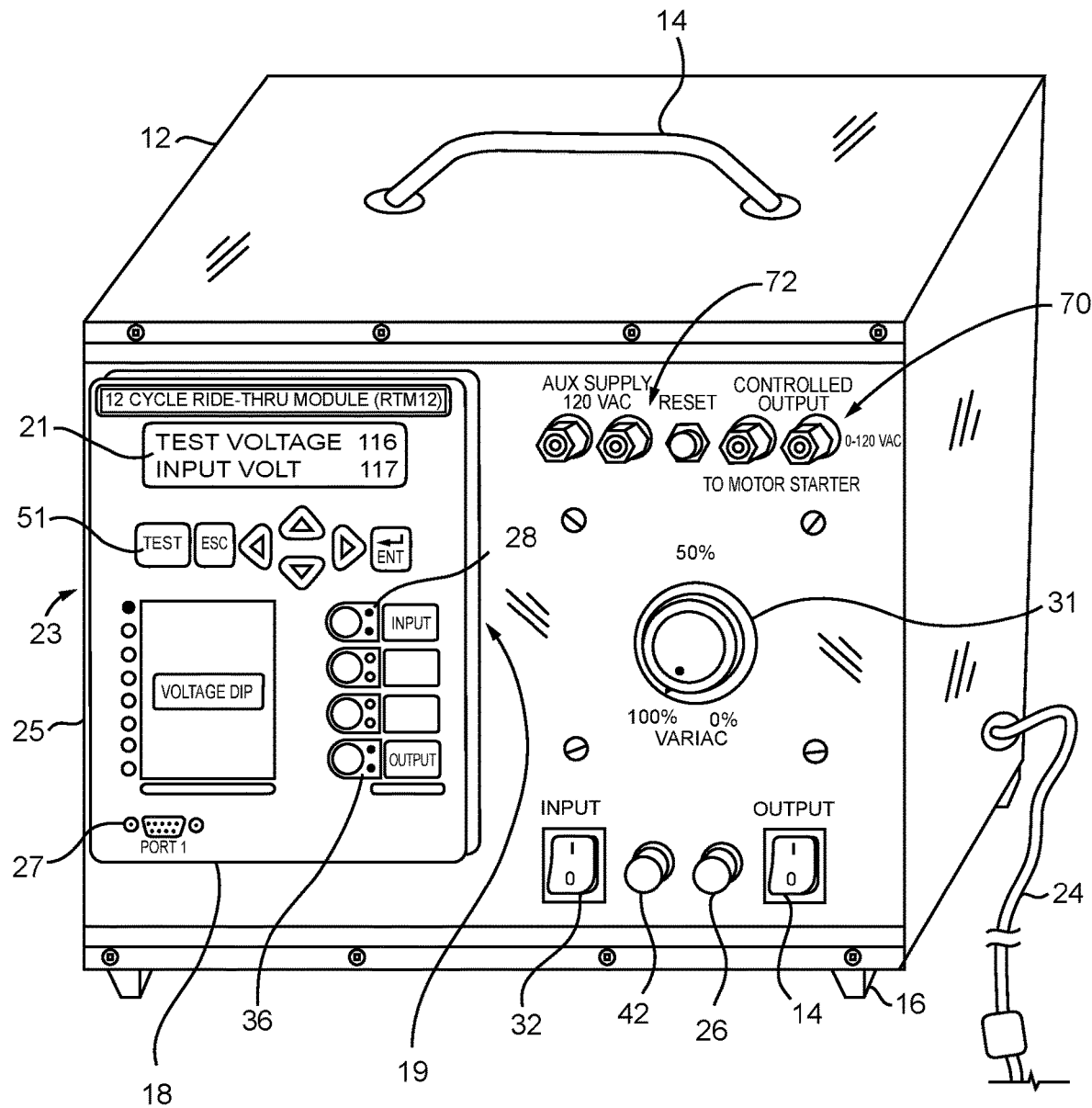
FIG. 1 is a front, top perspective view of a portable low voltage ride-through (LVRT) test apparatus for testing the ride-through capabilities of a motor starter in accordance with the present invention.

In the following description of the invention, identical reference numerals have been used, when appropriate, to designate the same or similar elements that are common to the figures. Unless specifically stated otherwise, the features shown in the figures are not drawn to scale, but are shown for illustrative purposes only.

DETAILED DESCRIPTION OF THE INVENTION

The present invention is directed to a method and apparatus for testing and observing ride-through capabilities of a motor starter for an electric motor illustratively located at a utility plant (e.g., waste water treatment plant) or an industrial manufacturing/processing plant (e.g., a petrochemical refinery), among other facilities requiring medium and high voltage motors that operate various types of machinery (e.g., compressors, pumps, presses, etc.). The ride-through (RT) test apparatus is preferably a light-weight, portable test device that can be easily transported, e.g., hand carried or wheeled, from one motor starter location to another, for example at an industrial or manufacturing plant/facility. The ride-through test apparatus can be used by a technician to selectively close and apply a voltage drop having a predetermined magnitude and duration (e.g., zero volts for 200 milliseconds) at the input of the low voltage control circuit of a motor starter, and then returning the input voltage to its normal voltage (i.e., 120 VAC). The RT test apparatus provides ample time for the technician to observe the physical behavior, e.g., if/when the solenoids of the motor starter trip open to determine the motor starter's ride-through capabilities. The RT test apparatus includes a variable transformer and a relay with programmable logic circuitry from which a technician can manually set/change the magnitude and duration of the voltage drop in accordance with the manufacturer's ride-through specifications of the motor starter, if available. Otherwise, the technician can incrementally change the magnitude and duration of the RT test apparatus to identify, by trial and error, the ride-through characteristics, if any, of the motor starter. In this manner, the ride-through test apparatus of the present invention enables a plant, factory or other industrial facilities technician to routinely determine, for example, as part of a facility maintenance program, the ride-through capabilities of different types of motor starters for its electric motors at the facility. For purposes of illustration only, the ride-through test apparatus and method of using the same are discussed in conjunction with testing the ride though capabilities of a motor starter associated with a high voltage electric motor of processing or manufacturing equipment at an industrial plant or facility, and such illustrative application of the test apparatus is not considered limiting.

A detailed discussion of the ride-through test apparatus is shown and described below with respect to FIGS. 1-4. A detailed description of a method for using the ride-through test device with an electric motor starter is illustratively described and shown below with respect to FIGS. 5A-5B.

Referring to FIGS. 1-4, a preferred embodiment of the portable, low voltage ride-through test apparatus 10 of the present invention is illustratively shown. The RT test apparatus 10 includes a cabinet or housing 12 that forms an enclosure to house electronic circuitry 20 (FIGS. 2 and 3) for selectively generating a voltage drop at the input of a low voltage control circuit of an AC motor starter under test. The housing 12 is illustratively rectangular in shape and includes a handle 14 to carry the RT test apparatus 10, e.g., to a test site and storage after use. Although the handle 14 is illustratively shown as being mounted on the top exterior of the housing 12, such configuration is not to be considered limiting. For example, a handle 14 can have a different shape and/or be mounted or extend from a side and/or rear portion of the housing 12. A plurality of supports or legs 16 is positioned on the bottom of the housing 12 to support the RT test apparatus 10. Although the supports 16 are shown as being stationary, such configuration is not to be considered limiting. For example, the supports can include one or more caster wheels or rollers. The housing 10 can be fabricated from any light-weight material such as aluminum, stainless steel, or other suitable metals and alloys or a durable polymeric material, and can be formed integrally or as separate components that are assembled together by fasteners, snap-fittings and/or other well-known techniques.

Figure 2:
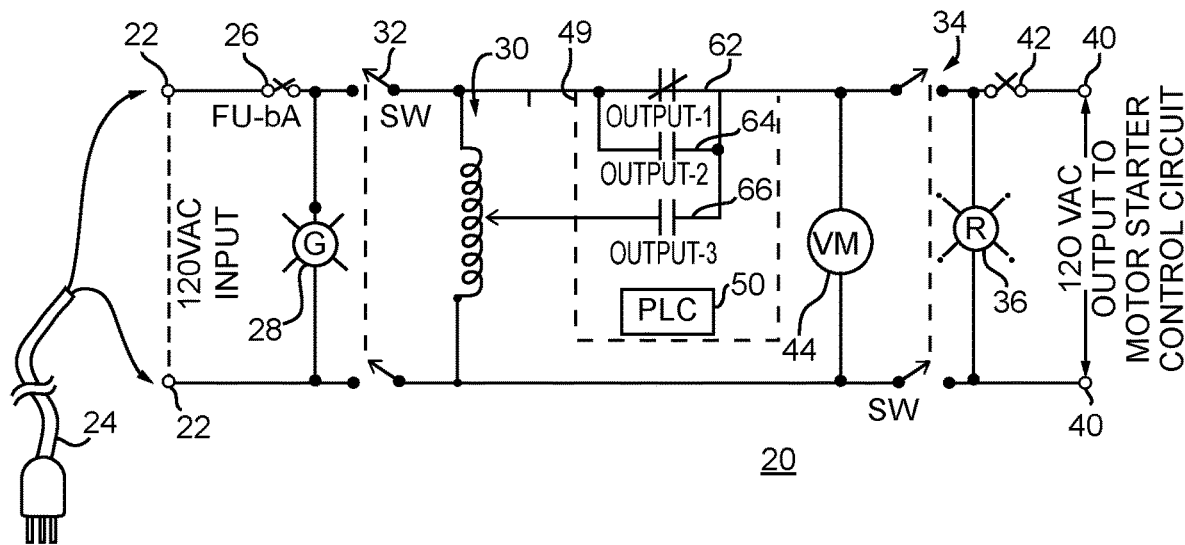
FIG. 2 is an schematic circuit diagram of the portable LVRT test apparatus of FIG. 1.

Referring to FIG. 2, the electronic circuitry 20 of the RT test apparatus 10 includes a pair of input terminals 22 for receiving a conventional 120 VAC, 60 Hz electric power from an external power source; a pair of output terminals 40 for selectively delivering, via a pair of conductive wire probe/clips (FIG. 4), an input voltage to the low voltage control circuitry of a motor starter (not shown) under test; a variable transformer 30 for selectively adjusting the magnitude of the voltage drop at the output terminals 40; and programmable logic circuitry (PLC) 50 for selectively providing and setting the duration of the voltage drop at the output terminal 40 via a relay switch 49. The electronic circuitry 20 can be configured on-site by technician by manually adjusting the variable transformer 30 and programming the PLC 50 via a laptop or other computer device (not shown) to provide a temporary voltage drop at the input terminals of a motor starter's control circuit to thereby observe the ride-through capabilities of the motor starter under test.

More specifically, the pair of electrical input terminals 22 is configured to receive external power from a conventional electric wall outlet/socket (e.g., 120 volt (V) 60 Hz) via a power cord 24. The power cord 24 includes a plug at its proximal end for insertion into a conventional 120 VAC electrical socket (e.g., wall, bench or other electrical outlet), and a distal end which passes through an aperture formed in the housing 12 and is routed therein so that the conductors are soldered to the input terminals 22. Although the present invention is discussed using a 120 VAC 60 Hz input voltage, such voltage metric is not considered limiting. For example, the present invention is suitable for use with a 120 VAC 50 Hz input signal, among other voltage input signals. Preferably, the power cord includes a ground conductor which is electrically connected to the housing 12 in a well-known manner. Alternatively, power cord can be removable from the test device in which the housing 12 includes a pair of female jacks (not shown) which are electrically connected to the terminals 22, and are configured to receive a detachable power cord having corresponding male connectors at the distal ends of the conductors. An input circuit protection device 26 such as a fuse or circuit breaker is preferably provided serially between one of the terminals 22 and the variable transformer 30 in a well-known manner to protect the RT test apparatus from undesirable power spikes occurring from the 120 VAC power source at the processing/manufacturing plant.

The electronic circuitry 20 further includes and input switch 32, an input power indicator lamp 28, an output switch 34, an output power indicator lamp 36, a pair of output terminals 40, and an output overcurrent protection device (e.g., fuse or circuit breaker) 42. The input switch 32 enables the technician to manually turn on and off the RT test apparatus 10 by providing the 120 VAC input power signal from the electrical wall socket to the primary windings of the variable transformer 30 and the programmable logic circuitry 50. The input power indicator lamp 28 will glow or otherwise emit light when the RT test apparatus 10 is turned on.

The variable transformer 30 includes a manually rotatable dial or knob 31 (FIG. 1), preferably with voltage markings thereon, to select the magnitude of the voltage drop to be provided at the output terminals 40 via the transformer tap and PCL 50. The variable transformer 30 includes primary and secondary windings in which the primary winding is electrically coupled to the input terminals 22 and the secondary winding (tap) electrically coupled to the output terminals 40. The variable transformer 30 can be any suitable commercially single-phase, 120 VAC rated transformer, such as a Variac model no. 201 (2 Amp) variable transformer from Staco Energy Products Company, although such variable transformer is not considered limiting.

Figure 3:
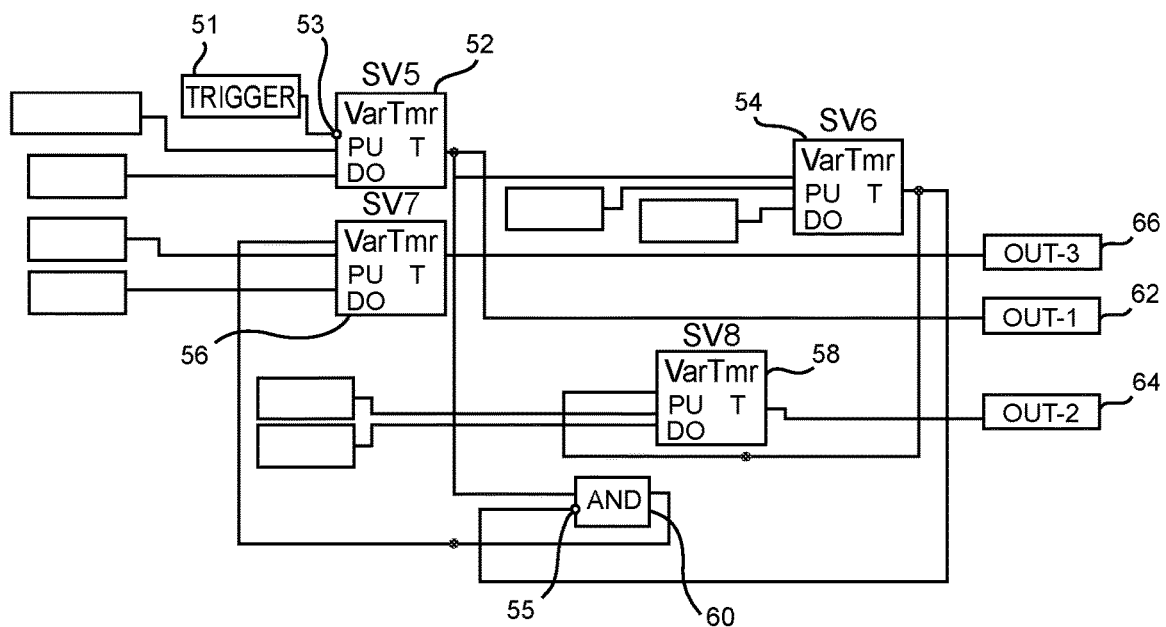
FIG. 3 is a schematic diagram of the logic circuitry of the LVRT test apparatus of FIG. 1.

Referring to FIG. 3, the programmable logic 50 circuitry controls the timing of the voltage being provided at the output terminals 40, as well as the duration of the voltage drop being applies across the output terminals. The PLC 50 controls a relay 49 having three outputs which are electrically connected to the output terminal 40, and illustratively includes four sequentially programmable timers, i.e., first timer 52, second timer 54, third timer 56, fourth timer 58 and an AND gate 60, all of which are associated with Boolean logic to provide the required result. In an illustrative embodiment, the first timer 52 has an input connected to a "Test" button or trigger 51 (FIG. 1) through a NOT gate 53, and is programmed with an OUTPUT-1 62 through another NOT gate 55 to thereby maintain a normally closed contact through which the starter motor is initially closed during testing. The output of the first timer 52 is also connected to the input of the second timer 54, which has an output connected to the input of the fourth timer 58 and to a NOT input of the AND gate 60. The output of the AND gate 60 is connected to the input of the third timer 56. The output of the third timer 56 is programmed as OUTPUT-3 and the output of the fourth timer 58 is programmed as OUTPUT-2, as also illustratively shown in FIG. 2. The PLC 50 and OUTPUTS-1 through -3 are illustratively shown in FIG. 2 as being part of a single relay 49 unit such as, for example, a model SEL-551 overcurrent/reclosing relay manufactured by Schweitzer Engineering Laboratories of Pullman Wash., USA. A person of ordinary skill in the art will appreciate that such integral configuration is not considered limiting as the relay 49 and the PLC 50 can be provided in the housing 12 using separate components.

Figure 4:
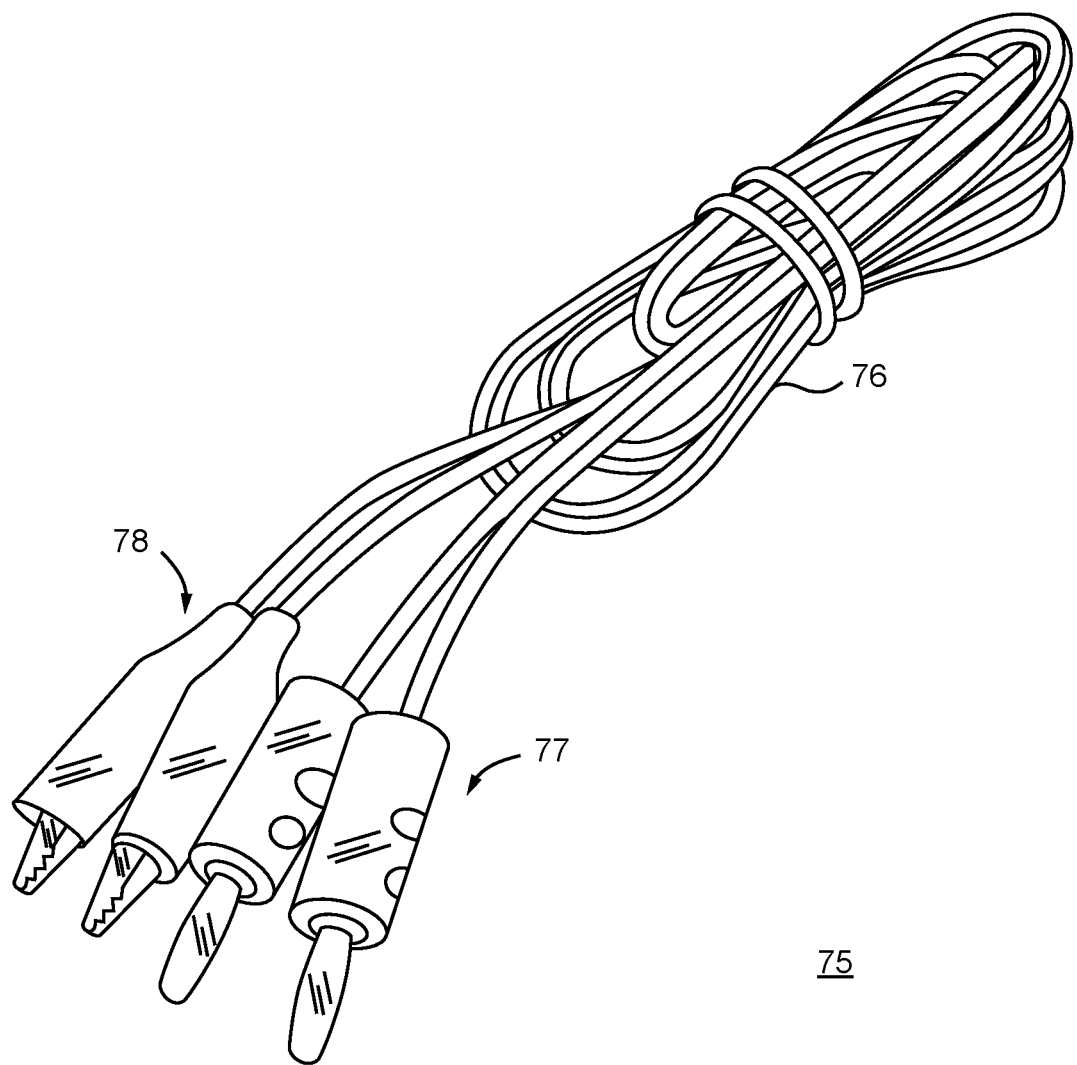
FIG. 4 is a perspective view of a pair of conductive probes suitable for providing a voltage drop from an output of the LVRT test apparatus to an input of the motor starter's control circuit.

Referring now to FIGS. 1 and 4, the housing 12 is illustratively shown having a first pair of female connectors or output jacks 70. The first pair of female output jacks 70 forms or is electrically connected to the output terminals 40 of the electronic circuitry 20. Optionally, a second pair of female connectors 72, (e.g., AUX jacks) is electrically connected to the input terminals 22 of the electronic circuitry to provide an alternate source of 120 VAC from the RT test apparatus 10. The output voltage, i.e., OUTPUT-1 or OUTPUT-2 or OUTPUT-3, from the female output jacks 70 is provided to the inputs of the control circuit of the motor starter via a pair of conductive wire leads 75. In one embodiment, the wire leads are well-known conductive probes as illustratively shown in FIG. 4. The wire leads 75 include a conductive wire 76 having a proximal end with a male connector 77 that is inserted into a corresponding female output jack 70 provided on the front exterior of the housing 12. The distal ends of each conductive wire lead 75 can be an alligator type clip 78 or configured in any other well-known arrangement to securely fasten to and apply the required voltage to the input terminals of the motor starter's control circuit. A person or ordinary skill in the art will appreciate that a second set of wire leads 75 can be used to provide 120 VAC from the auxiliary jacks 72, as required.

Referring again to FIG. 1, the housing 12 further includes a control panel 19 having a display 21, control buttons 23 (including navigation buttons and the TEST button 51), the input and output power indicator lamps 28 and 36, and a connector (e.g., USB, D-type or other connector) 27 for connecting a laptop or other computer device to program the PLC 50 and relay 49. The RT test apparatus 10 includes a power (e.g., voltage) meter 44 which indicates, in real time on the display 21, the input voltage (e.g., 120V AC) and the magnitude of the voltage the technician sets on the variable transformer 30 (e.g., zero volts). Optionally, the display 21 can indicate the duration of the voltage drop that is programmed into the timers of the PLC 50 (e.g., 200 milliseconds).

Figure 5A:
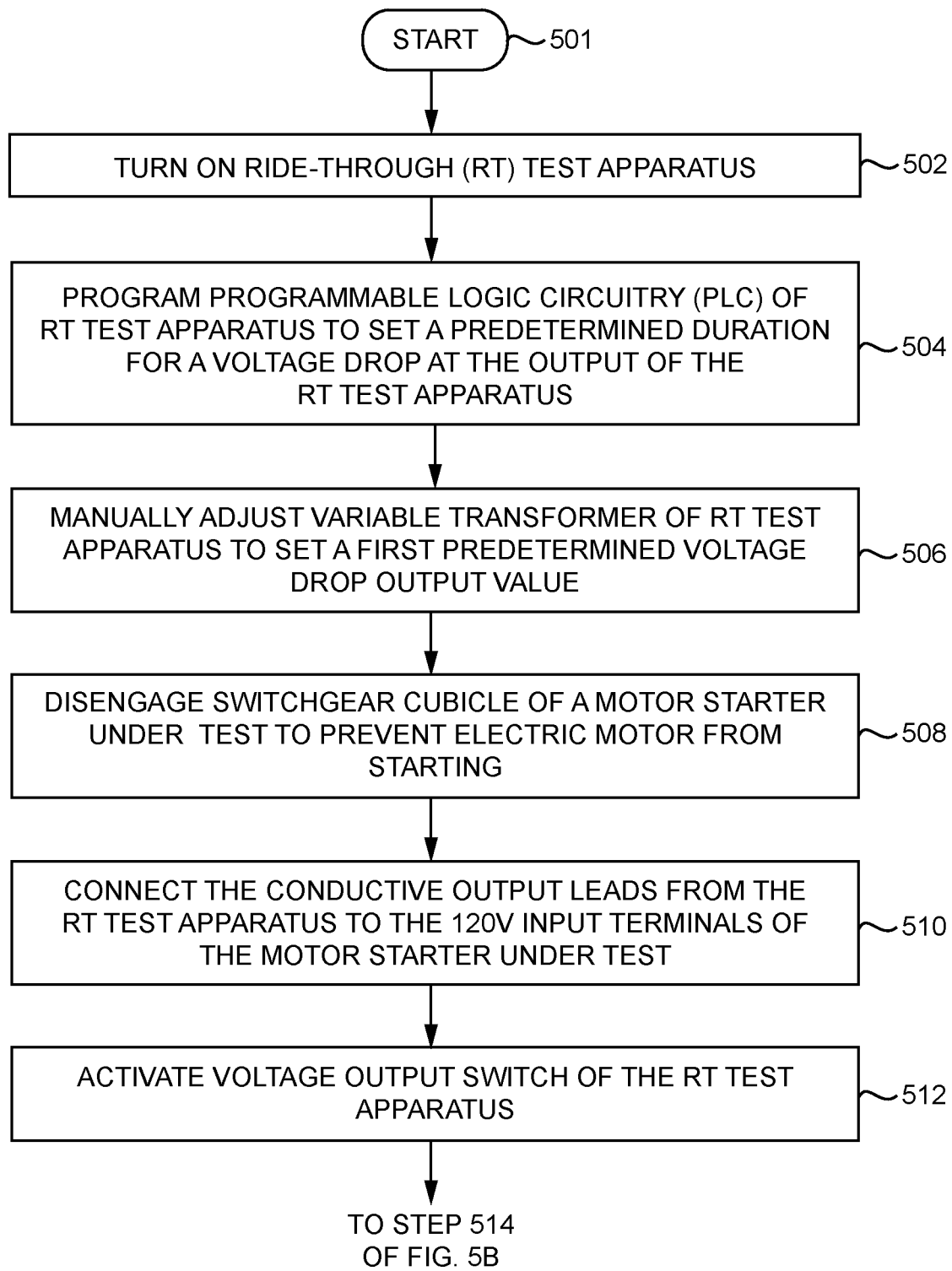
FIGS. 5A-5B collectively depict a flow diagram describing a method for determining LVRT characteristics of a motor starter using the test apparatus of FIG. 1.
Figure 5B:
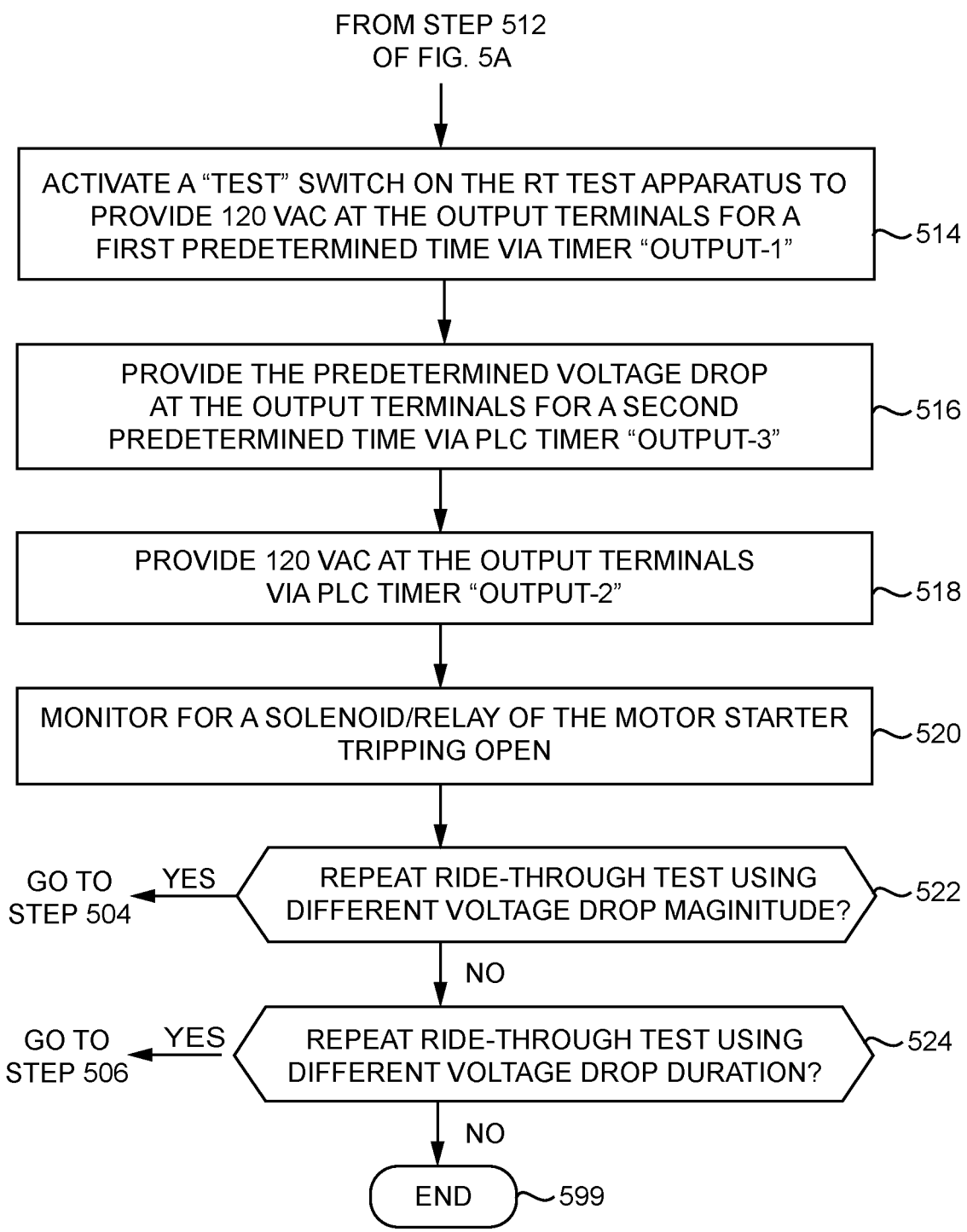

Referring to FIGS. 5A-5B, a method 500 for testing the ride-through capabilities of a motor starter using the RT test apparatus 10 of the present invention is illustratively shown. Referring now to FIG. 5A, the method 500 starts at step 501, where a maintenance or field technician at a refinery, manufacturing plant or other industrial facility with high voltage electric motors used to run their machinery is using the portable RT test apparatus 10, as illustratively shown and described with respect to FIGS. 1-4, to detect the ride-through capabilities of a motor starter. The RT test apparatus 10 is lightweight and portable, thereby allowing the technician to easily carry the portable RT test apparatus 10 by its handle 14 to the location of the motor starter under test.

At step 502, the technician identifies the manufacturer's specified ride-through capabilities (i.e., duration or cycles/second) of the particular motor starter under test, and turns on the RT test apparatus 10. In particular, the plug of the power cord 24 is inserted into a local 120 VAC electrical outlet and the input power switch 32 is pressed or otherwise switched to its "on" position. Once turned on, power is delivered to the PLC 50 and the primary windings of the variable transformer 30. Additionally, the input power indicator lamp 28 will emit light to indicate power is actually being supplied to the RT test apparatus. It is noted that the PLC 50 includes circuitry (not shown) to convert the 120 VAC input power to a suitable power level (e.g., 5 Volts DC) for operating the logic circuitry. The method 500 then proceeds to step 504.

At step 504, the technician can optionally connect a laptop or other computer device to the input connector 27 of the RT test apparatus 10 to check the programming of the PLC 50 and outputs of the relay 49. In one embodiment, the timers of the PLC 50 are pre-programmed to provide a voltage drop duration of twelve cycles (200 milliseconds for the 120 VAC, 60 Hz input signal) as a default duration. If the technician confirms that no changes to the programming are necessary, the method 500 proceeds to step 506. Otherwise, the technician can use the laptop to set the required cycles of the input voltage to be counted to set the duration of the voltage drop which will be provided at the output jacks 70 of the RT test apparatus 10.

At step 506, the technician sets the variable transformer 30 to define the magnitude of the first predetermined voltage drop provided at the output jacks 70 of the RT test apparatus 10. For example, the technician can rotate the dial or knob 31 of the variable transformer 30 to zero volts if the voltage drop is to be 100% or some other desired value (e.g., 50% which is 60 VAC). The rotatable knob 31 includes voltage markings to indicate the approximate voltage drop being introduced. Preferably, the technician can read the exact voltage being set on the secondary winding (tap) of the transformer 30 on the voltage meter display 21 on the control panel 19.

At step 508, the technician disengages the switchgear in the cubicle of the motor starter to prevent the power circuit of the motor starter from delivering high voltage power to the electric motor. For maximum safety, the motor starter is disconnected from the switchgear cubicle.

At step 510, the proximal ends 77 of the output conductive leads 75 are connected to the output jacks 70 and the distal ends 78 are connected to the input terminals of the control circuitry of the motor starter. At step 512, the technician turns on the output switch 34 of the RT test apparatus 10 to electrically connect the output terminals 40 to the secondary winding of the variable transformer 30 and outputs of the relay 49. The second power indicator lamp 36 will emit light to indicate to the technician that power is being delivered to the outlet terminals 40. More specifically, a constant 120 VAC will be provided to the terminals 40 via the controlled OUTPUT-1 of the relay circuitry 49, as shown in FIG. 3. At this time, only the magnetic contactor of the motor starter will receive power, since the motor starter is disengaged from the cubicle. Therefore, no power will be able to flow to the HV electric motor. The method 500 then proceeds to step 514.

Referring to FIG. 5B, at step 514, the technician activates the test button 51 to initiate the testing of the motor starter. At this time the first timer 52 will begin to count the predetermined number of voltage cycles, e.g., 600 cycles necessary to achieve the predetermined time period, e.g., 10 seconds, the technician needs to position/ready him/herself to monitor the physical behavior of the motor starter. Although the first timer 52 is illustratively set to count for 600 cycles, such value is not limiting, as the first timer 52 can be set to count any number of cycles to produce a sufficient time period to accommodate the technician for subsequently observing the operation of the relays/solenoids of the starter motor, i.e., to see/hear if they trip from a closed state to an open state. It is noted that if the relays/solenoids trip open, the technician will immediately know that the motor starter does not have the ride-through capability at the voltage dip magnitude and duration parameters being tested by the RT test apparatus 10. It is further noted that the output of the first timer 52 and the second timer 54 (NOT gate) are ANDed to initiate the third timer 56. The third and fourth timers 56 and 58 are primarily introduced to obtain a transition time during the switching of output contacts. One to two cycles are added for the contacts to switch positively.

At step 516, once the first predetermined time period lapses and the first timer 52 turns off, the word bit at the third timer 56 will direct power through the OUTPUT-3 relay contact, which will supply the voltage differential to the motor starter. More specifically, the second timer 54 counts for the predetermined number of cycles so that the voltage drop parameters set in steps 504 and 506 appears at the output terminals 40 (wire conductors 75) via OUTPUT-3. Continuing with the exemplary values described above at steps 504 and 506, the second timer 54 will provide at the terminals 40 via OUTPUT-3 of the relay 49, a voltage drop of zero volts (0 VAC) for the duration of 200 milliseconds, i.e., twelve cycles of the 120 VAC, 60 Hz input signal. Once the second timer 54 generates its Word bit after 12 cycles, the third timer 56 and its OUTPUT-3 are turned off, and the method 500 proceeds to step 518. At step 518, the fourth timer 58 supplies the 120 VAC signal to the output terminals 40 via the OUTPUT-2 contact of the relay 49, as shown in the schematic circuit of FIG. 3.

At step 520, the technician monitors for an indication that a relay/solenoid of the motor starter tripped open while conducting the ride-through test using the RT test apparatus 10. During the 12 cycle voltage drop, the motor starter under test should remain closed, meaning the motor starter has ride-through capabilities for the voltage drop metrics used during the test. In order to determine the exact cycle settings the motor starter trips open, the technician can repeat the ride-through test method 500 using different voltage drop values. If at step 522, for example, the technician wants to run the ride-through test to determine exactly what voltage the motor starter opens, the method 500 proceeds to step 504, where a different voltage drop magnitude is provided by setting the variable transformer 30, as described above. In addition or alternatively, at step 524, if the technician wants to determine the exact cycle that the motor starter opens, the method 500 proceeds to step 506, where the second timer 54 is programmed with different input clock count values. The technician can repeat the test a number of times to find the exact input clock count value that the motor starter relays/solenoids will open.

For example, the technician can start testing the motor starter illustratively at 20 cycles and sequentially reduce the programmed clock count until the motor starter trips at a lower cycle count. Alternatively, the technician can start testing the motor starter illustratively at 8 cycles and sequentially increase the programmed clock count until the motor starter trips at a higher cycle count. Once the technician determines that the trip point has deviated less or more than the required 12 cycles or other manufacturer specified value, the technician can adjust the RC circuitry according to the manufacture's specifications so that the motor starter will sustain exactly a 12 cycle voltage drop. If at steps 522 and 524 no further ride-through testing of the motor starter is to be performed, the method 500 ends at step 599. The technician then turns off the RT test apparatus 10, disconnects the wire conductors 75 from the input terminals of the starter motor control circuit, and reinstalls/reinserts the motor starter back into the cubicle. The technician can then transport the RT test apparatus 10 and conduct the testing at another motor starter location in accordance with method 500.

Advantageously, the RT test apparatus 10 and the method of using it to test ride-through capability on a motor start are significantly different from the prior art voltage drop devices and equipment used today. For example, the equipment disclosed in the prior art discussed above are heavy duty lab type equipment which connect directly with the power system for the machinery. The prior art voltage drop devices act as a source of power for a sag voltage and directly apply the voltage sag the load, i.e., the electric motor itself. In fact, the prior art sag generators administer voltage disturbances directly to the motor so that the technician can monitor the characteristic of the load. Accordingly, the prior art test apparatus are mostly heavy machinery with transformers, synchronous generators and the like, are costly to manufacture and are not readily transportable by the technician in an industrial environment. These prior art sag generators are not suitable for conducting maintenance checks on the motor starters during industrial plant operations.

By comparison, the ride-through test apparatus 10 is of a simple electronic design which is light weight, portable, and can be operated by a single person. Conducting the ride-through tests using the RT test apparatus of the present invention is different over the prior art in that it is not a source of power, nor is it directly connected with load. Rather, the RT test apparatus of the present invention acts as a voltage 'manipulator' in the control system instead of the power system of electric motor. In an industrial environment where maintenance and troubleshooting of processing and manufacturing machinery is a significant concern of management, the RT test apparatus 10 provides a simple non-comprehensive testing device which can be used by a technician with minimal training. It can easily be maintained, moved from substation to substation on a daily basis and is cost effective to operate. Accordingly, the RT test apparatus is a maintenance test device, as opposed to a specific research device. In most instances, plant management does not demand a detailed study of electrical equipment during a sag condition arises, as continuance of operation of the processing plant is the ultimate objective. In such cases, the RT test apparatus supersedes all the above and can be used to evaluate the root cause of the equipment failure during voltage sag and thereby enable the technician to quickly fix the problem without delay and the process plants will be on line without much down time. That is, a voltage dip is apparent when transient recorders or other measuring instruments are used to monitor motor starters. However, where a motor starter trips off during a voltage sag condition, a primary cause of the trip would be the absence of a ride-through mechanism within the starter motor. Accordingly, it is desirable to have a ride-through test apparatus which can provide early detection of motor starter ride-through capabilities at a facility.

While the foregoing is directed to several embodiments of the present invention, other and further embodiments and advantages of the invention will be apparent to those of ordinary skill in the art based on this description without departing from the scope of the invention, which is to be determined by the claims that follow.

What is claimed is:
1. A ride-through test apparatus for providing a predetermined voltage drop on a control circuit of a motor starter comprising:
   a housing having an interior;
   a variable transformer mounted in the housing interior and having a primary winding and a secondary winding, the primary winding being electrically connected to an input voltage from an external alternating current (AC) power source and the secondary winding coupled to a pair of output terminals, the pair of output terminals being configured for electrical connection to input terminals of the control circuit of the motor starter, the variable transformer having a control knob accessible from an exterior portion of the housing for manually setting magnitude of a voltage potential on the secondary winding;

a programmable logic circuit (PLC) mounted in the housing interior and including a plurality of programmable timers electrically coupled to the pair of output terminals, the plurality of timers having outputs and being programmed to sequentially turn on and off for selectively controlling voltage potential magnitude and duration at the pair of output terminals based on clock cycles of the input voltage; and a first switch electrically coupled to the PLC for activating the timers to sequentially provide (i) the AC input voltage at the pair of output terminals for a first predetermined time, (ii) the predetermined voltage drop having a magnitude corresponding to the voltage potential on the secondary winding of the variable transformer for a second predetermined time after the first predetermined time lapses, and (iii) the AC input voltage at the pair of output terminals after the second predetermined time lapses.

2. The ride-through test apparatus of claim 1, further comprising an input power switch attached to an exterior portion of the housing to provide power from the AC power source to the primary winding of the variable transformer.

3. The ride-through test apparatus of claim 2, further comprising an output power switch attached to the exterior portion of the housing to provide power to the pair of output terminals.

4. The ride-through test apparatus of claim 1 further comprising a current protection device for preventing passage of an undesirable power surge from the AC power source.

5. The ride-through test apparatus of claim 1 further comprising a handle provided on an exterior portion of the housing.

6. The ride-through test apparatus of claim 1 further comprising a pair of probe leads each having a proximal end and a distal end, the proximal ends being configured for electrical connection with one of the pair of output terminals, and the distal ends being configured for electrical connection with input connections of the control circuit of the motor starter.

7. The ride-through test apparatus of claim 1 further comprising at least one support coupled to a lower portion of the housing to support the ride-through test apparatus on a surface.

8. The ride-through test apparatus of claim 1, further comprising a voltage meter having a display mounted on the housing and electrically connected to the secondary winding of the variable transformer.

9. The ride-through test apparatus of claim 1, wherein the PLC includes a plurality of timers in which a first timer counts a first predetermined number of cycles of the AC input voltage to enable a user to prepare for monitoring the motor starter for the first predetermined time, a second timer for counting a second number of cycles of the AC input voltage to cause the voltage drop to occur on the pair of output terminals for the second predetermined time, and third and fourth timers for providing the input voltage at the pair of output terminals after the second predetermined time lapses.

10. The ride-through test apparatus of claim 1, wherein the input voltage to the primary windings of the variable transformer is a 120 VAC, 60 Hz input signal.

11. The ride-through test apparatus of claim 1 further comprising a voltage meter arranged to read a voltage potential at the secondary winding of the variable transformer.

12. The ride-through test apparatus of claim 1 further comprising a display panel for displaying voltage potentials of the primary and secondary windings of the variable transformer.

13. The ride-through test apparatus of claim 1 further comprising a connector configured to provide data flow from a computer device to program the PLC.

14. A method for providing a predetermined voltage drop on a control circuit of a motor starter using a ride-through (RT) test apparatus including a housing having an interior; a variable transformer mounted in the housing interior and having a primary winding and a secondary winding, the primary winding receiving an AC input voltage and the secondary winding electrically coupled to a pair of output terminals, the variable transformer having a control knob accessible from an exterior portion of the housing; and a programmable logic circuit (PLC) mounted in the housing interior and including a plurality of programmable timers electrically coupled to the pair of output terminals, the plurality of timers having outputs and being programmed to sequentially turn on and off for selectively controlling voltage potential magnitude and duration at the pair of output terminals based on counting clock cycles of the AC input voltage; the method comprising:

providing the AC input voltage to the primary winding of the variable transformer via a power cord connected to an external power source;

programming the timers of the PLC to set a duration of the predetermined voltage drop occurring at the output terminals of the RT test apparatus during a RT test;

setting the control knob of the variable transformer to set a predetermined magnitude of a voltage potential on the secondary winding;

connecting a proximal end of a first of the pair of probe leads to a first of the pair of outputs of the RT test apparatus and a distal end of the first probe lead to input terminals of the control circuit of the motor starter;

disengaging a power circuit of the motor starter;

activating a test switch electrically coupled to the PLC for sequentially activating the timers and providing the AC input voltage at the pair of output terminals for a first predetermined time;

providing, at the pair of output terminals after the first predetermined time lapses, the predetermined voltage drop having a magnitude corresponding to the voltage potential on the secondary winding of the variable transformer for a second predetermined time;

providing, at the pair of output terminals after the second predetermined time lapses, the AC input voltage;

monitoring for a relay or solenoid of the motor starter to remain closed or trip open; and repeating the method at a different second predetermined time until the relay or solenoid of the motor starter trips open.

15. The method of claim 14, wherein prior to activating the test switch the method comprises activating an output switch to provide the AC input voltage at the pair of output terminals.

16. The method of claim 14, wherein: the step of providing the AC input voltage to the primary winding includes providing a 120 VAC, 60 Hz input signal to the primary winding; the step of programming the PLC to set the predetermined duration for the voltage drop occurring at the output terminals includes programming at least one of the timers of the PLC to count 600 cycles of the AC input voltage; and the step of providing the voltage potential on the secondary winding of the variable transformer for a second predetermined time includes programming at least one of the timers of the PLC to count 12 cycles of the AC input voltage.

17. The method of claim 14, wherein the step of setting the control knob of the variable transformer includes setting the secondary winding of the variable transformer to zero volts.

* * * * *